United States Patent
Ito et al.

(10) Patent No.: US 11,375,650 B2
(45) Date of Patent: Jun. 28, 2022

(54) PICK-UP TOOL AND MOUNTING DEVICE

(71) Applicant: FUJI CORPORATION, Chiryu (JP)

(72) Inventors: Hidetoshi Ito, Okazaki (JP); Jinya Imura, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/976,934

(22) PCT Filed: Mar. 13, 2018

(86) PCT No.: PCT/JP2018/009778
§ 371 (c)(1),
(2) Date: Aug. 31, 2020

(87) PCT Pub. No.: WO2019/175980
PCT Pub. Date: Sep. 19, 2019

(65) Prior Publication Data
US 2021/0045271 A1    Feb. 11, 2021

(51) Int. Cl.
*H05K 13/04* (2006.01)
(52) U.S. Cl.
CPC ................ *H05K 13/0408* (2013.01)
(58) Field of Classification Search
CPC ........... H05K 14/0408; H05K 14/0409; H05K 14/041; H05K 13/0408; H05K 13/0409; H05K 13/041
See application file for complete search history.

(56) References Cited

U.S. PATENT DOCUMENTS

2002/0040519 A1    4/2002 Hattori
2015/0237773 A1*   8/2015 Nishiyama ......... H05K 13/0404
                                                29/743

FOREIGN PATENT DOCUMENTS

| JP | 5-152782 A    | 6/1993 |
| JP | 2006-196618 A | 7/2006 |
| JP | 2011-14726 A  | 1/2011 |
| JP | 5902836 B2    | 4/2016 |

OTHER PUBLICATIONS

International Search Report dated May 29, 2018 in PCT/JP2018/009778 filed on Mar. 13, 2018, citing documents AO-AQ therein, 2 pages.

* cited by examiner

*Primary Examiner* — Livius R. Cazan
(74) *Attorney, Agent, or Firm* — Oblon, McClelland, Maier & Neustadt, L.L.P.

(57) ABSTRACT

The pick-up tool is a tool used in a mounting device configured to mount a component on a board supported by backup pins disposed on a backup plate. The pick-up tool includes an attaching portion configured to be attached to a moving head moving the backup pin; a slit formed in an insertion direction in which an engaging portion formed on the distal end of the backup pin is inserted; and a groove, being formed orthogonally to the slit, into which the engaging portion enters.

10 Claims, 8 Drawing Sheets

PICK-UP TOOL AND MOUNTING DEVICE

TECHNICAL FIELD

In this specification, a pick-up tool and a mounting device are disclosed.

BACKGROUND ART

Conventionally, a mounting device has been provided in which, for example, components are mounted on a board supported by backup pins, and the backup pins are picked up and rearranged by backup pin pick-up nozzles (for example, refer to Patent Literature 1 and 2). In the device of Patent Literature 1, the backup pins can be automatically rearranged by a mounting head. Further, the device of Patent Literature 2 improves the reliability of the rearrangement by providing a tapered portion on the distal end of the backup pin and using the incline of the tapered portion as a guide. Further, a mounting device has been provided in which the backup pin is gripped and placed (refer to, for example, Patent Literature 3). In the device of Patent Literature 3, the gripping state of the backup pin can be detected.

PATENT LITERATURE

Patent Literature 1: JP-A-H05-152782
Patent Literature 2: JP-A-2011-14726
Patent Literature 3: JP-B-5902836

BRIEF SUMMARY

Technical Problem

However, in the mounting devices described in Patent Literature 1 to 3, the movement of the backup pins strongly depends on the condition of the backup pins being picked up, and when a backup pin is not picked up in a satisfactory manner, the backup pin is likely not to be moved reliably.

It is an object of the present disclosure to provide a pick-up tool and a mounting device that can more reliably move backup pins.

Solution to Problem

The pick-up tool and the mounting device disclosed in this specification adopt the following means to achieve the main object described above.

The present specification discloses a pick-up tool used in a mounting device configured to mount a component on a board supported by backup pins arranged on a backup plate, the pick-up tool comprising: an attaching portion configured to be attached to a moving head for moving the backup pin; a slit formed in an insertion direction in which an engaging portion formed on the distal end of the backup pin is inserted; and a groove, being formed orthogonally to the slit, into which the engaging portion enters.

The pick-up tool is attached to the moving head configured to move the backup pin, the engaging portion formed on the distal end of the backup pin is inserted into the slit formed in the insertion direction of the backup pin, and the engaging portion is fixed by entering into the groove formed orthogonally to the slit. Since the engaging portion is fixed by entering orthogonally to the slit and thereby reducing the possibility of the backup pin slipping or falling, moving of the backup pin can be performed more reliably.

DESCRIPTION OF EMBODIMENTS

Figure 1:
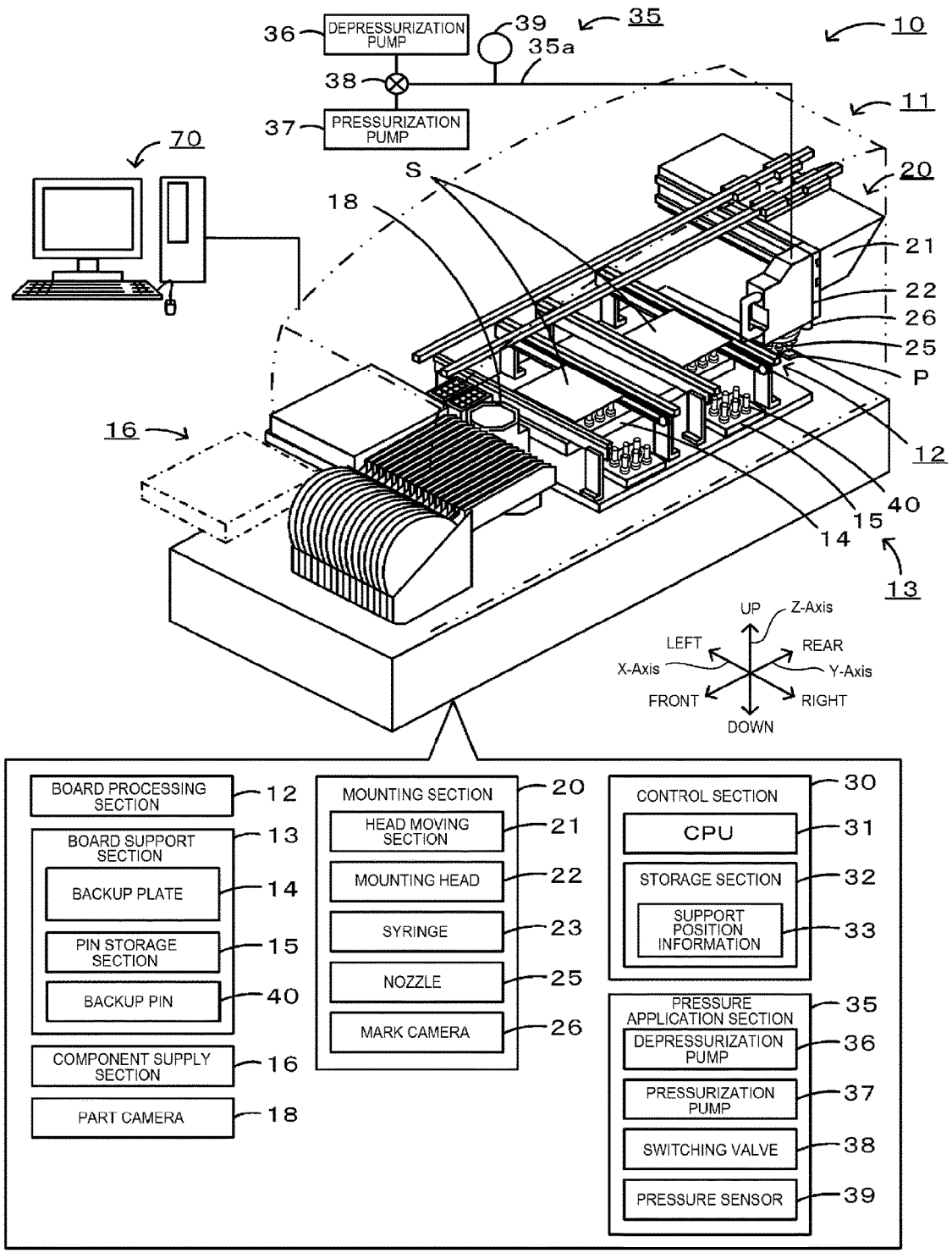
FIG. 1 A schematic diagram showing an example of mounting system 10.
Figure 2:
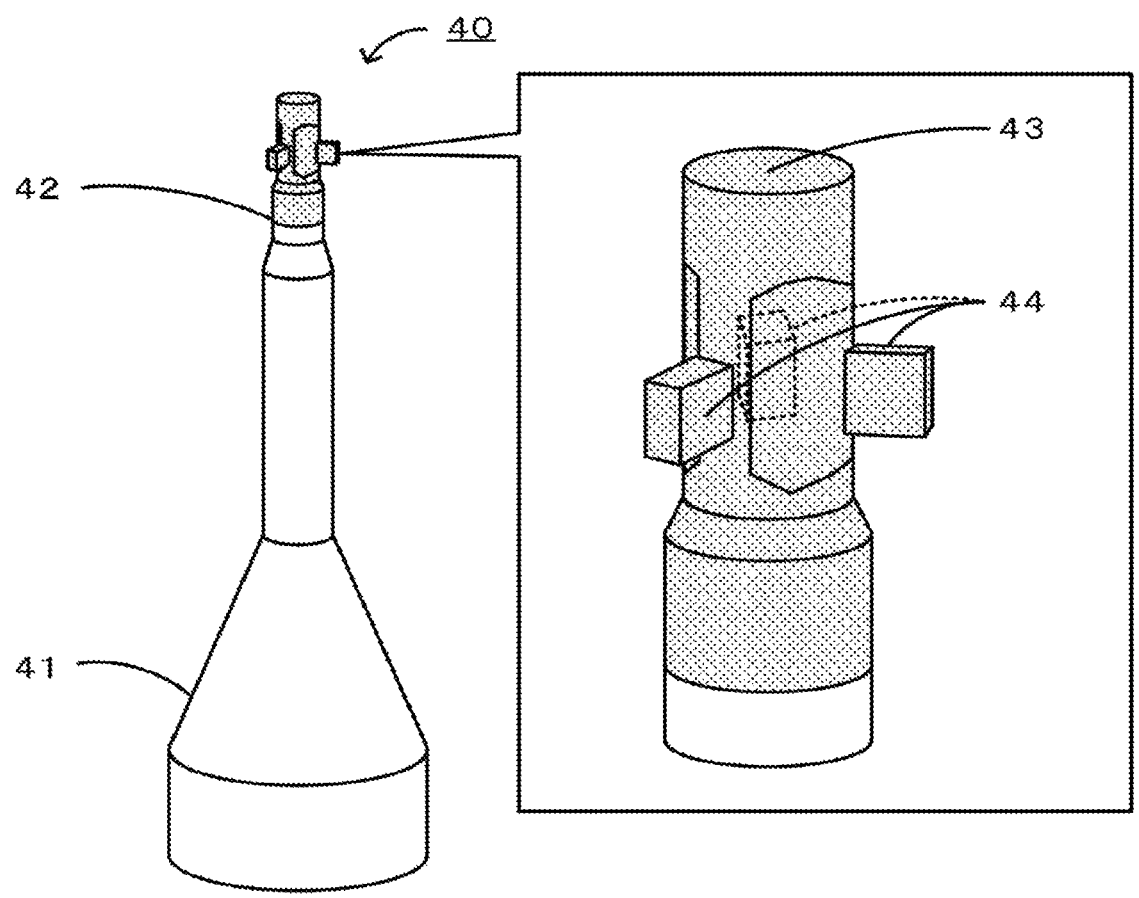
FIG. 2 A diagram showing backup pin 40.
Figure 3:
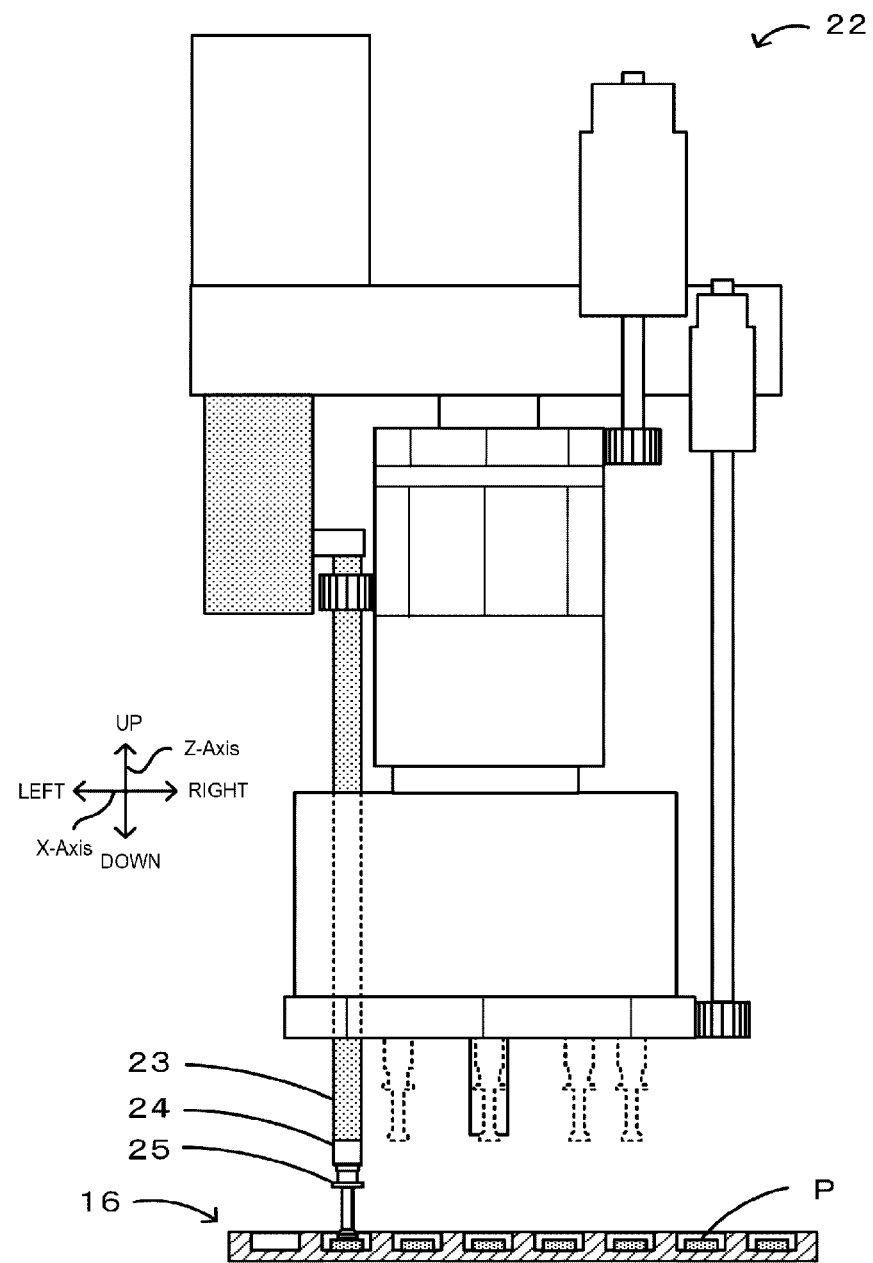
FIG. 3 A diagram showing mounting head 22.
Figure 4A:
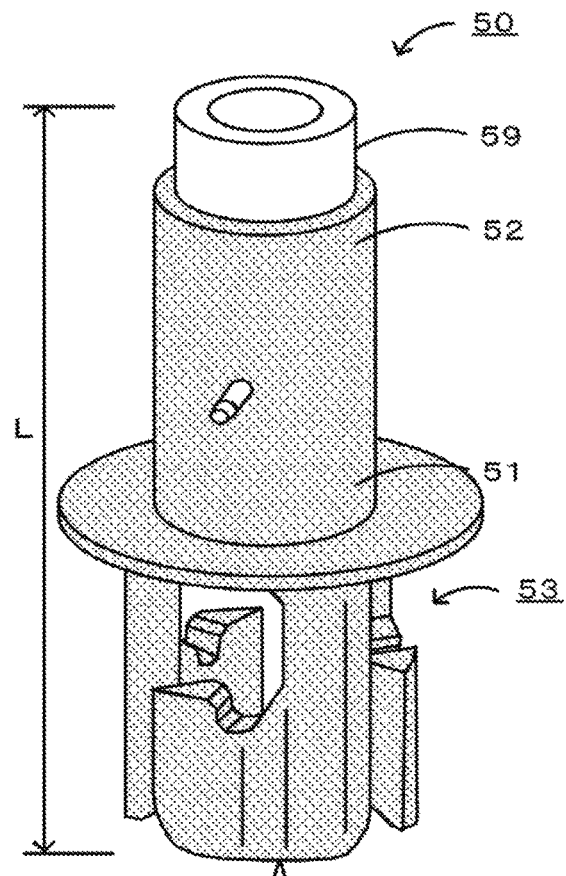
FIG. 4 A diagram showing pick-up tool 50 and nozzle 25.
Figure 4B:
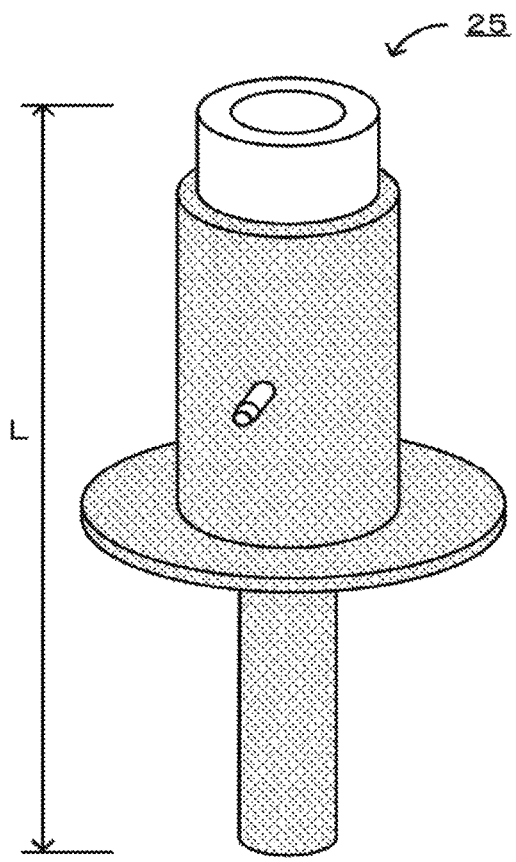
Figure 4B:
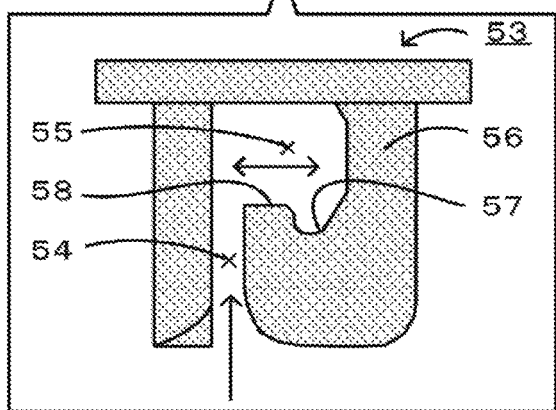
Figure 5:
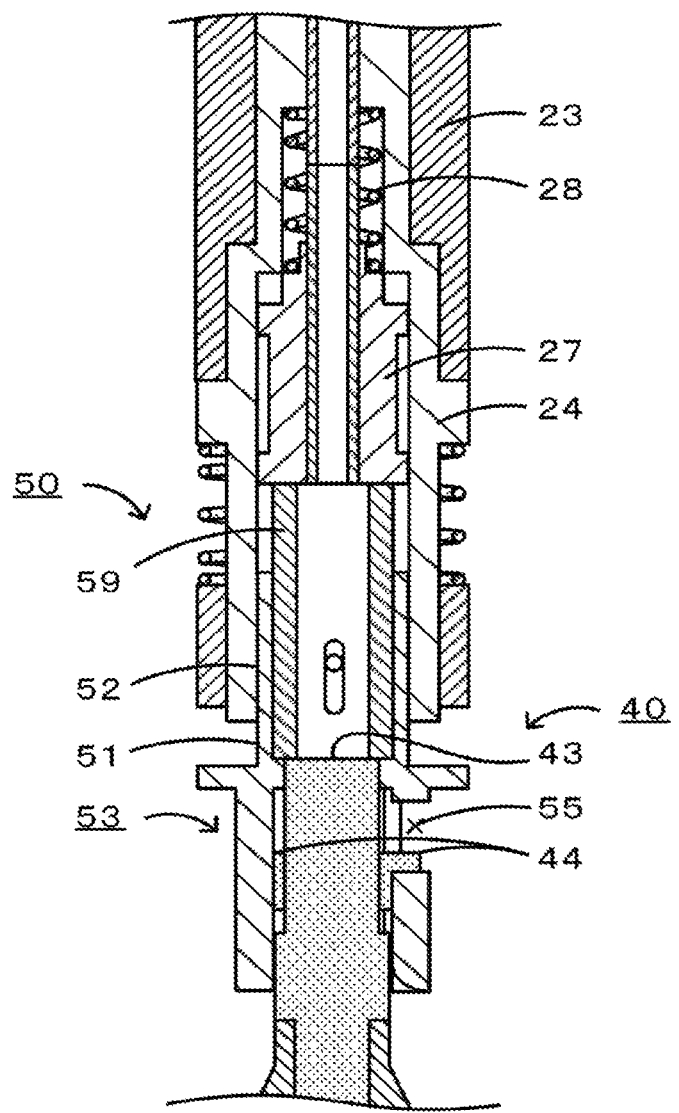
FIG. 5 A diagram showing pick-up tool 50 picking up backup pin 40.

The present embodiment will be described below with reference to the drawings. FIG. 1 is a schematic diagram showing an example of mounting system 10 of the present disclosure. FIG. 2 is a diagram showing of backup pin 40. FIG. 3 is a diagram showing mounting head 22. FIG. 4 is a diagram of pick-up tool 50 (FIG. 4A) and nozzle 25 (FIG. 4B). FIG. 5 is a diagram of pick-up tool 50 picking up backup pin 40. Mounting system 10 is, for example, a system for mounting component P on board S. Mounting system 10 includes mounting device 11 and management computer (PC) 70. Mounting system 10 is configured as a mounting line in which multiple mounting devices 11 are arranged from an upstream to a downstream. In FIG. 1, only one mounting device 11 is shown for convenience of description. Management PC 70 is configured as a server for managing information of each device of mounting system 10. Management PC 70 manages mounting condition information including mounting jobs used in the mounting process of component P, support position information 33 including the arrangement positions of backup pins 40 corresponding to board S to be produced, and the like. In the present embodiment, the left-right direction (X-axis), the front-rear direction (Y-axis), and the up-down direction (Z-axis) are as shown in FIGS. 1 and 3.

Mounting device 11 is a device, for example, for mounting components on board S supported by backup pins 40 disposed on backup plate 14. Mounting device 11, as shown in FIG. 1, is provided with board processing section 12, board support section 13, component supply section 16, part camera 18, mounting section 20, control section 30, and pressure application section 35.

Board processing section 12 is a unit for conveying in, conveying, fixing at a mounting position, and conveying out board S. Board processing section 12 has dual lanes made up of a first lane and a second lane. Board processing section 12 has a pair of conveyor belts provided at intervals in the front and rear and spanning the lateral direction. Board S is conveyed by these conveyor belts.

Board support section 13 is a unit for supporting, from below, board S fixed to board processing section 12. Board support section 13 includes backup plate 14, pin storage section 15, and backup pins 40. Backup pins 40 are arranged on backup plate 14 at positions stored in support position information 33 that are compatible with board S. Backup plate 14 is a flat plate-shaped member and is disposed below the conveyor of board processing section 12. Backup plate 14 is lifted and lowered by a lifting and lowering device (not shown). Backup plate 14 is disposed in a lower standby position during standby and is disposed in an upper support position when supporting board S when supporting board S. Backup plate 14 has magnetic material on the upper face. Backup plate 14 is fixed by the magnetic force of backup pins 40. Pin storage section 15 stores unused backup pins 40. Pin storage section 15 is disposed in an area next to backup plate 14 aside from the area below board S to be fixed to board processing section 12.

Backup pins 40 are rod-shaped members for supporting board S. As shown in FIG. 2, backup pins 40 has base portion 41 and support portion 42. Base portion 41 is made to be fixed to backup plate 14 and pin storage section 15, and a magnet is embedded in the lower portion. Support portion 42 is formed above base portion 41, and the upper face is a support surface 43 for supporting board S. Engaging portions 44 for engaging with pick-up tool 50 are formed under support surface 43. Each engaging portion 44 is a protruding member, and three engaging portions are provided on support portion 42 at intervals of 120° when viewed from above. Having two or more engaging portions 44 is preferable for stabilization during movement, three is more preferable, and four is also good. The shape of engaging portion 44 is not particularly limited, and may be a cylindrical shape, a rectangular parallelepiped, or a cubic shape.

Component supply section 16 has multiple feeders or tray units with reels, detachably attached to the front of mounting device 11. A tape is wound around each reel, and multiple components P are held on the surface of the tape along the longitudinal direction of the tape. The tape is unwound rearward from the reel and is fed by a feeder to a pick-up position where the components, in an exposed state, are picked up by nozzle 25. Each tray unit has a tray on which multiple components are arranged and placed and moves the tray into and out of a predetermined pickup position.

Mounting section 20 picks up component P from component supply section 16 and places the component on board S which is fixed to board processing section 12. As shown in FIGS. 1, 3, and 5, mounting section 20 includes head moving section 21, mounting head 22, syringe 23, holder 24, nozzle 25, and mark camera 26. Head moving section 21 is provided with a slider that moves in the XY direction, guided by guide rails, and a motor for driving the slider. Mounting head 22 is detachably attached to the slider and is moved in the XY direction by head moving section 21. One or more nozzles 25 are detachably attached to the lower face of mounting head 22 via syringe 23 and holder 24. Recessed and protruding portions that fit together are formed on holder 24 and nozzle 25. As shown in FIG. 5, biasing member 27 and pressurized spring 28 are disposed inside syringe 23. Biasing member 27 is a member for pressing downward a constituent part of nozzle 25 or pick-up tool 50 attached to holder 24, and is formed in a hollow cylindrical shape to apply pressure. Pressurized spring 28 is an elastic member for pressing biasing member 27 downward. Nozzle 25 is a pick-up member for picking up components by utilizing negative pressure. The pick-up member may be a holding member for holding and picking up components P. Mark camera 26 is fixed to the lower face of the slider. The imaging range of mark camera 26 is below mark camera 26. Mark camera 26 images the reference mark provided on board S or the upper surfaces of backup pins 40 and outputs the images to control section 30. Control section 30 detects the position of board S or directions of backup pins 40, and the like based on the image captured by mark camera 26. Mounting head 22, with pick-up tool 50 attached, also serves as a moving head for picking up and moving backup pin 40. That is, mounting head 22 moves backup pin 40 between backup plate 14 and pin storage section 15 with pick-up tool 50 attached when a new backup pin 40 is to be placed or when backup pin 40 is to be exchanged.

Pick-up tool 50, as shown in FIGS. 4 and 5, is provided with main body 51, attaching portion 52, pick-up portion 53, and pressing member 59. Pick-up tool 50 is compatible with nozzle 25, which picks up and moves component P. Pick-up tool 50 may have, for example, the same mounting portion as nozzle 25 or may have the same length L (see FIG. 4) at the time of mounting. Main body 51 is a cylindrical member, the upper portion being attaching portion 52 and the lower portion being pickup portion 53. Attaching portion 52 is a portion to be attached to holder 24 of mounting head 22. Attaching portion 52 is inserted into and fixed to holder 24. Pick-up portion 53 is a portion for picking up back-up pin 40, and as shown in FIG. 4A, is configured by slit 54, groove 55, bent wall 56, support portion 57, protruding portion 58, and the like. Slit 54 is formed in the insertion direction (i.e., the up-down direction) for inserting engaging portion 44 formed on the distal end of backup pin 40. Groove 55 is a space, orthogonal to slit 54, into which engaging portion 44 enters. Pick-up tool 50 has three slits 54 and grooves 55 corresponding to three engaging portions 44 of backup pin 40. Bent wall 56 is a wall formed between slit 54 and groove 55 next to slit 54. Bent wall 56 is thinner than the portion below it due to the presence of groove 55. Therefore, bent wall 56 suppresses deformation, damage, or the like of mounting head 22 structures (e.g., syringe 23 and holder 24) by bending when the applied stress exceeds a predetermined value. Support 57 is a part for supporting engaging portion 44 and is a support surface provided below groove 55. Protruding portion 58 is formed on the slit side of groove 55, which communicates with slit 54, and is a part for restricting movement of engaging portion 44. Since the movement of engaging portion 44 is restricted by protruding portion 58, it is possible to suppress unexpected disengaging of back-up pin 40 and the like. Pressing member 59 is a member for pressing backup pin 40 in a direction to suppress axial rotation of backup pin 40 when engaging portion 44 is inserted in groove 55. Pressing member 59 is a hollow cylindrical member, as shown in FIG. 5, and is urged downward by pressurized spring 28 via biasing member 27 when pick-up tool 50 is attached to syringe 23. In this configuration, the lower surface of pressing member 59 abuts against support surface 43, urging backup pin 40 downward. Further, with pressing member 59 and support surface 43 being in contact, the pressure applied from pipe 35a is maintained inside pressing member 59. Therefore, control section 30 can determine whether backup pin 40 is present through leakage pressure between pressing member 59 and support surface 43.

Figure 6A:
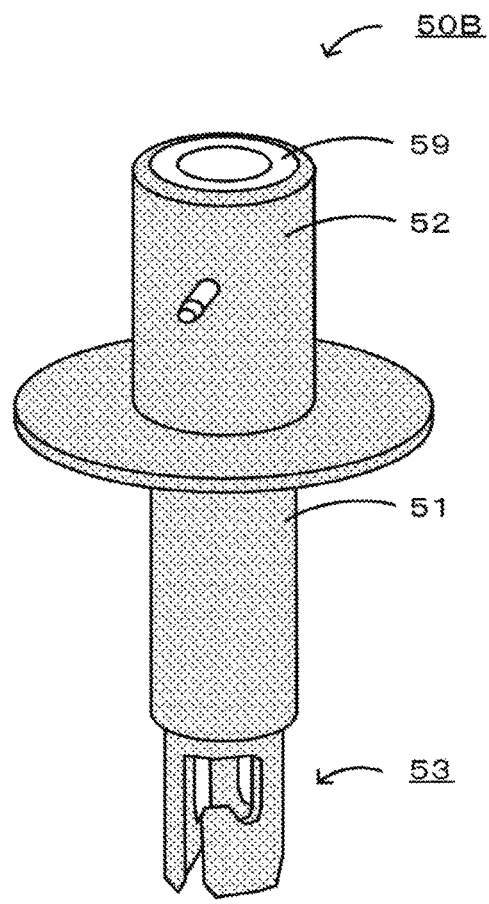
FIG. 6 A diagram showing another pick-up tool 50B.
Figure 6B:
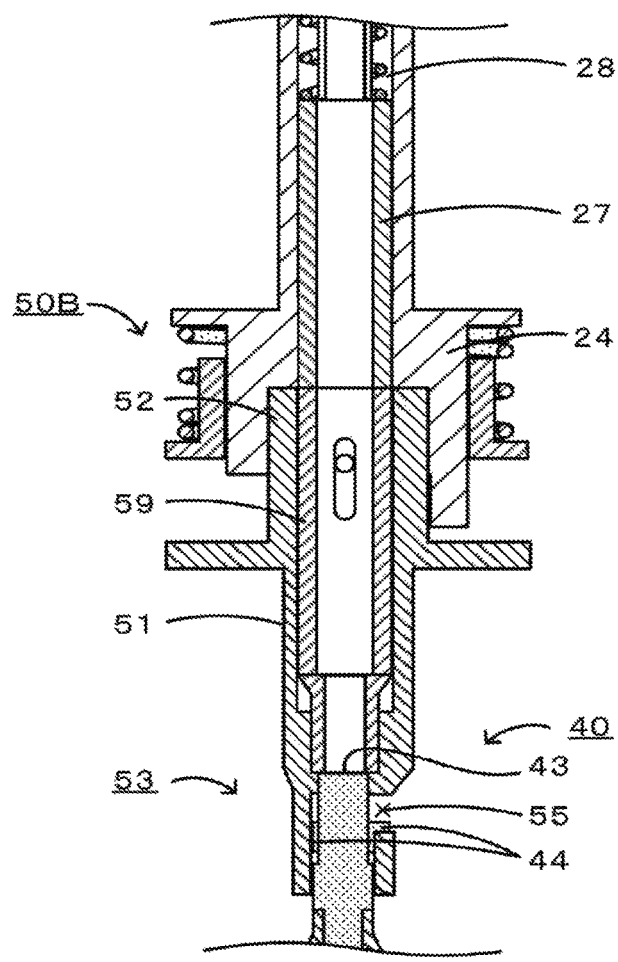
Figure 7A:
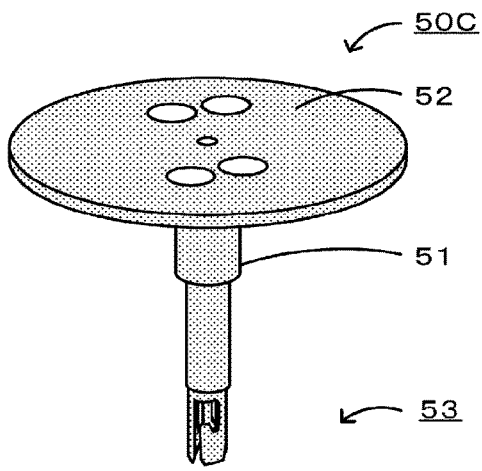
FIG. 7 A diagram showing another pick-up tool 50C.
Figure 7B:
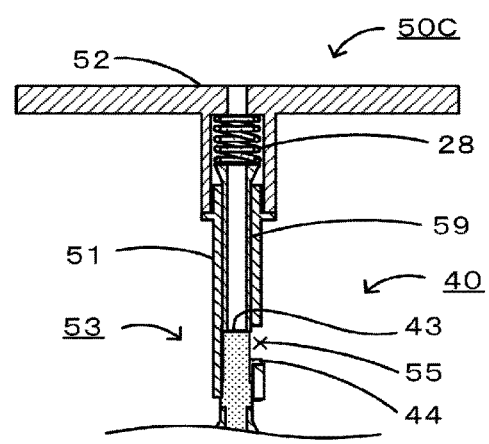

The tool for picking up and moving backup pin 40 is not limited to pick-up tool 50 and may be, for example, pick-up tool 50B shown in FIG. 6 or pick-up tool 50C shown in FIG. 7. FIG. 6 is a view of another pick-up tool 50B, in which diagram 6A is a perspective view and diagram 6B is a cross-sectional view. FIG. 7 is a view of another pick-up tool 50C, in which diagram 7A is a perspective view and diagram 7B is a cross-sectional view. In FIGS. 6 and 7, the same components as those of pick-up tool 50 are denoted by the same reference numerals and description thereof is omitted. Pick-up tool 50B has a cylindrical main body 51 below a flange in a similar manner as pick-up tool 50. Pick-up tool 50C has a flange-shaped attaching portion 52 and attaching portion 52 is attached and fixed to holder 24 by negative pressure supplied from syringe 23. Further, pick-up tool 50C incorporates pressurized spring 28 for urging pressing member 59 downward.

Part camera 18 (imaging section) is a device for capturing an image and is a unit for imaging one or more components P picked up and held in mounting head 22. Part camera 18 is disposed between component supply section 16 and board processing section 12. The imaging range of part camera 18 is above part camera 18. Further, part camera 18 images mounting head 22 attached with pick-up tool 50, and outputs the image to control section 30. Control section 30 recognizes the position and the rotational position of pick-up tool 50 based on the image captured by part camera 18.

Pressure application section 35 is a unit for supplying negative pressure and positive pressure required for operation of the device. Pressure application section 35 also provides pressure to nozzle 25 for picking up component P and pressure to pick-up tool 50. Pressure application section 35, as shown in FIG. 1, is provided with pipe 35a, depressurization pump 36, pressurization pump 37, switching valve 38, and pressure sensor 39. Pipe 35a is connected to depressurization pump 36 and pressurization pump 37 via switching valve 38. Pressure application section 35 supplies negative pressure or positive pressure to pipe 35a by switching the switching valve 38. Pressure sensor 39 measures the pressure of pipe 35a and outputs a signal of the measurement result to control section 30. Pressure application section 35 is connected to mounting head 22 and supplies pressure to nozzle 25 and pick-up tool 50 via syringe 23.

As shown in FIG. 1, control section 30 is configured as a microprocessor with centralized CPU 31 and includes storage section 32 for storing various types of data. Control section 30 outputs control signals to board processing section 12, component supply section 16, part camera 18, mounting section 20, and pressure application section 35, and receives signals from mounting section 20, component supply section 16, and part camera 18. Storage section 32 stores mounting condition information and support position information 33. The mounting condition information includes mounting job, such as the mounting order in which components P are mounted on board S and the arrangement positions of components P. Mounting device 11 executes the mounting process based on the mounting condition information. Support position information 33 is information including the positions of backup pins 40 supporting board S. Mounting device 11 uses support position information 33 to automatically rearrange backup pins 40. When this occurs, control section 30 moves backup pins 40 between pin storage section 15 and backup plate 14 by inserting engaging portion 44 into groove 55 through slit 54. Further, control section 30 performs a process of determining the holding state of backup pin 40 held in pick-up tool 50 based on the pressure applied to pick-up tool 50. When applying positive pressure to pipe 35a, control section 30 determines whether backup pin 40 is present based on whether the measured value at pressure sensor 39 is above a predetermined reference value. When applying negative pressure to pipe 35a, control section 30 determines whether backup pin 40 is present based on whether the measured value at pressure sensor 39 is below a predetermined reference value.

Figure 8:
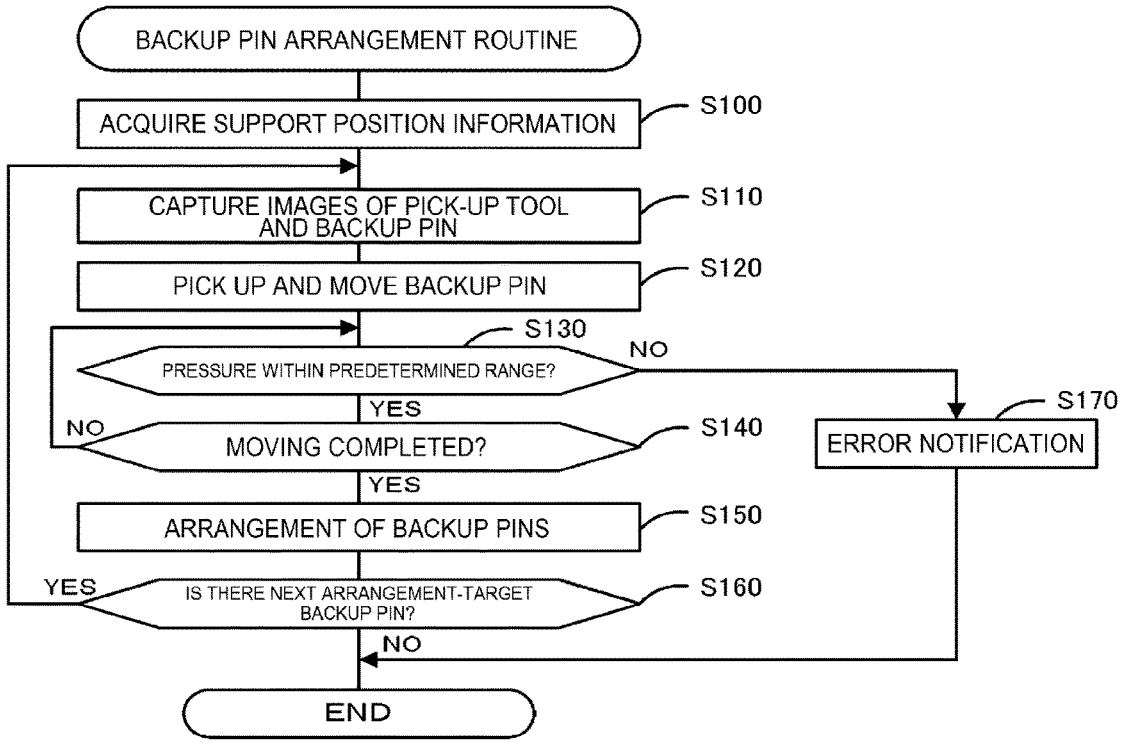
FIG. 8 Flowchart showing an example of a backup pin arrangement routine.

Next, the operation of mounting device 11 of the present embodiment configured as described above, in particular, the process of arranging backup pins 40 on backup plate 14 based on support position information 33 will be described. FIG. 8 is a flowchart showing an example of a backup pin arrangement routine executed by CPU 31 of control section 30. This routine is stored in storage section 32 and is executed based on an input from the operator to begin the mounting process. When this routine is started, CPU 31 first reads and acquires support position information 33 (S100), attaches pick-up tool 50 to mounting head 22, and causes pick-up tool 50 and backup pins 40 to be imaged (S110). CPU 31 causes pick-up tool 50 to be imaged with part camera 18 and causes backup pins 40 to be imaged with mark camera 26. CPU 31 registers the position, orientation, and shape of pick-up tool 50 based on the captured image from part camera 18. Further, CPU 31 registers the position, rotational direction of engaging portions 44, and the shape of each backup pin 40 based on the captured image from mark camera 26. When the shape of pick-up portion 53 of pick-up tool 50 does not match with the shape of the reference image, CPU 31 reports the error to the operator on the assumption that pick-up portion 53 is deformed.

CPU 31 then causes mounting head 22 to pick up and move backup pin 40 (S120). CPU 31 moves pick-up tool 50 to a position above backup pin 40, lowers pick-up tool 50, and by rotating, engaging portions 44 are inserted into slits 54 enter into grooves 55 formed orthogonally to slits 54. In this state, backup pin 40 is pressed downward by the pressing member 59, engaging portions 44 are supported by support portions 57 and movement of engaging portions 44 are restricted by protruding portions 58. Incidentally, when, for example, engaging portions 44 do not enter slits 54 or grooves 55 in a normal manner due to engaging portions 44 or pick-up tool 50 being displaced, deformation of holder 24 and syringe 23 is prevented due to bent walls 56 being bent. As backup pins 40 move, CPU 31 positions backup pins 40 at defined positions on backup plate 14 corresponding to board S. In this process, CPU 31 moves backup pins 40 between backup plate 14 and pin storage section 15 or between a first position and a second position on backup plate 14.

Figure 9:
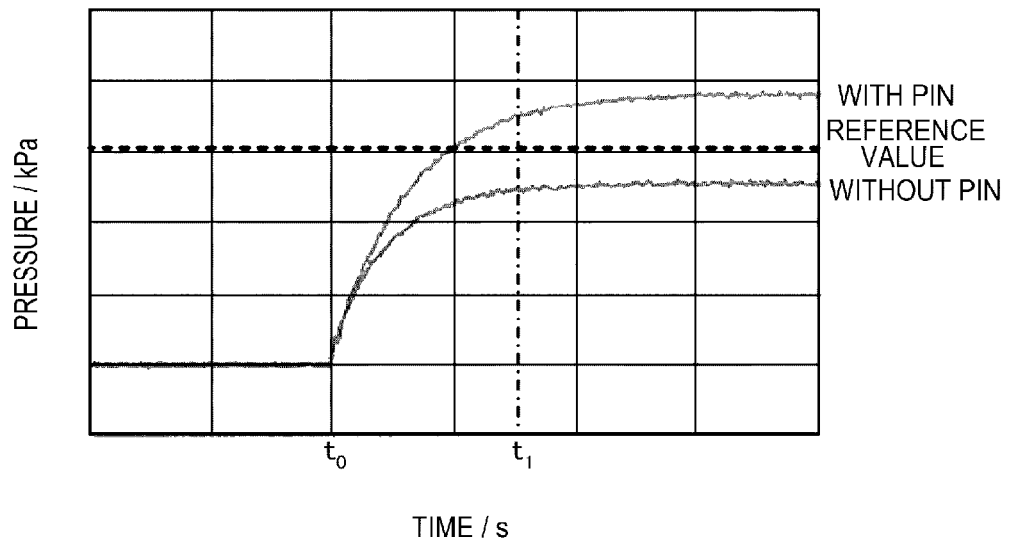
FIG. 9 A figure showing the relationship between the pressure of pick-up tool 50 and time in the presence or absence of backup pins.

When back-up pin 40 is moved, CPU 31 determines whether the pressure applied to pressing member 59 is within a predetermined range, with reference values as thresholds, after a predetermined period of time has elapsed (S130). Here, CPU 31 applies positive pressure to pressing member 59 and determines whether the pressure value obtained from pressure sensor 39 is above the reference value. FIG. 9 shows the relationship between the pressure of pick-up tool 50 and time in the presence or absence of a backup pin. As shown in FIG. 9, when backup pin 40 is successfully picked up, since pressing member 59 is in close contact with support surface 43, the pressure value from pipe 35a at time t1 after the lapse of a predetermined time from time t0 at which contact was made is equal to or higher than the reference value. On the other hand, when backup pin 40 is not picked up in a normal manner, the pressure value in pipe 35a even after a lapse of a predetermined time does not exceed the reference value because positive pressure leaks from pressing member 59. In this manner, CPU 31 determines whether backup pin 40 has been picked up based on the pressure applied to pressing member 59.

If the pressure value in pipe 35a is within the predetermined range and backup pins 40 have been picked up in a normal manner, it is then determined whether the movement of backup pins 40 has been completed (S140). If the movement of back-up pins 40 has not been completed, CPU 31 determines whether the pressure is within a predetermined range in S130 while continuing the movement until it is determined in S140 that the movement has been completed. If the movement has been completed in S140, backup pins 40 are then arranged (150). Here, CPU 31 pushes up pressing member 59, lowers pick-up tool 50 to the extent that engaging portion 44 overcomes protruding portion 58, and extracts engaging portion 44 from groove 55 and slit 54 by reverse rotation. When base portion 41 abuts against backup plate 14 or pin storage section 15, backup pin 40 is fixed to the abutting position by a magnetic force. CPU 31 then determines whether there is a next arrangement target backup pin 40 (S160), and when there is a next arrangement target backup pin 40, CPU 31 executes S110 and subsequent processes. On the other hand, when there is no next arrangement target backup pin 40 in S160, it is considered that moving and arranging of backup pins 40 has been completed and the routine is terminated.

On the other hand, if the pressure value in pipe 35a is outside of the predetermined range in S130, CPU 31 considers that backup pins 40 were not picked up in a normal manner and sends out an error notification (S170), and then terminates the routine. The operator, having checked the error, checks the pick-up status of backup pin 40 by pick-up tool 50 and the like and lifts the error. As described above, since backup pins 40 are properly arranged on backup plate 14 by executing the backup pin arrangement routine, mounting device 11 can shift to executing the mounting process.

Here, the correspondence between the elements of the present embodiment and the components of the present disclosure will be disclosed. Attaching portion 52 of the present embodiment corresponds to an attaching portion of the present disclosure, slit 54 corresponds to a slit, groove 55 corresponds to a groove, pressing member 59 corresponds to a pressing member, bent wall 56 corresponds to a bent wall. Further, mounting head 22 corresponds to a moving head, control section 30 corresponds to a control section, pressure application section 35 corresponds to a pressure application section.

Pick-up tool 50 of the present embodiment described above is attached to mounting head 22 for moving backup pin 40, engaging portion 44 formed on the distal end of backup pin 40 is inserted into slit 54 formed in the insertion direction of backup pin 40, and engaging portion 44 is fixed by entering into groove 55 formed orthogonally to slit 54. Since engaging portion 44 is fixed by entering orthogonally to slit 54 and thereby reducing the possibility of backup pin 40 slipping or falling, moving of backup pin 40 can be performed more reliably with this pick-up tool 50. Further, since picking up of backup pin 40 can be performed more reliably, it is possible to further increase the moving speed of backup pin 40 and also increase the arrangement accuracy of backup pin 40.

Further, since pick-up tool 50 has two or more slits 54 and grooves 55, it is possible to hold the backup pin in a more stable manner. In particular, since pick-up tool 50 has three slits 54 and grooves 55, there are few latching points between engaging portion 44 and groove 55 thereby facilitating manufacturing pick-up portion 53 and making the movement stability of backup pin 40 highly favorable. Furthermore, pick-up tool 50 has pressing member 59 for pressing backup pin 40 in a direction to suppress axial rotation of backup pin 40 when engaging portion 44 is inserted in groove 55. In pick-up tool 50, with pressing member 59, it is possible to more reliably move backup pin 40. Furthermore, since pick-up tool 50 is compatible with nozzle 25, which picks up and moves component P, pick-up tool 50 can be handled the same way as nozzle 25. For example, in pick-up tool 50, the movable range or the like can be the same as nozzle 25, no extra stroke or the like is required, and no special pick-up and arranging process is required. Further, pick-up tool 50 can also be stored in the storage section of nozzle 25.

Furthermore, pick-up tool 50 has a cylindrical main body 51, and between slit 54 and groove 55, which is next to slit 54, there is bent wall 56 which bends when a predetermined stress is applied. In pick-up tool 50, for example, when backup pin 40 is picked up and a stress higher than the allowable stress is applied, since the bent wall is bent, deformation, damage, and the like of the moving head structures (for example, a syringe to which pick-up tool is attached) is further suppressed, and the effect on the production plan is reduced. Pick-up tool 50 has protruding portion 58, for restricting the movement of engaging portion 44, formed on the slit 54 side of groove 55, which communicates with slit 54. In pick-up tool 50, since the movement of engaging portion 44 is restricted by protruding portion 58, it is possible to suppress unexpected disengaging of back-up pin 40 and the like.

Further, mounting device 11 of the embodiment includes mounting head 22 which attaches and moves above-described pick-up tool 50, and control section 30 for inserting engaging portion 44 into groove 55 via slit 54 and moving backup pin 40 between pin storage section 15 and backup plate 14. In mounting device 11, moving of backup pin 40 can be more reliably performed similarly to pick-up tool 50 described above. In mounting device 11, since mounting head 22 also serves as a moving head for moving the backup pin, it is not necessary to add a new unit or the like and the configuration can be further simplified. Further, even after mounting device 11 is installed, the automatic arrangement function of backup pin 40 can be easily added. Furthermore, control section 30 determines the holding state of backup pin 40 held in pick-up tool 50 based on the pressure applied to pick-up tool 50. In mounting device 11, the moving of the backup pin can be performed more reliably by determining the holding state of backup pin 40 based on pressure. Furthermore, pressure application section 35 applies pressure to pressing member 59, and control section 30 determines whether backup pin 40 is present based on the leakage pressure between support surface 43, which is the upper face of backup pin 40, and pressing member 59. In mounting device 11, it is possible to further suppress backup pin 40 from falling using pressing member 59 and determine whether backup pin 40 is present relatively simply by utilizing the leakage pressure. Since pressure application section 35 applies pressure to nozzle 25, which picks up component P, and also applies pressure to pick-up tool 50, the configuration is relatively simple, making it possible to more reliably move backup pin 40. Further, backup plate 14 fixes backup pin 40 by a magnetic force. In mounting device 11, since backup pin 40 is fixed to backup plate 14 relatively strongly, it is highly significant to employ pick-up tool 50 having a slit 54 and groove 55 which can be fixed more strongly after pick-up.

The control device and the mounting device of this disclosure are not limited to the embodiment that has been described heretofore, and hence, needless to say, the control device and the mounting device can be carried out in various modes without departing from the technical scope of the disclosure.

For example, the above-described embodiment had three of each of engaging portion 44, slit 54 and groove 55, but it is sufficient to have one or more, but considering the stability of the manufacturing process and backup pins 40, two to four is preferable.

In the embodiment described above, pick-up tool 50 has pressing member 59, but the present disclosure is not particularly limited thereto, and pressing member 59 may be omitted. Further, biasing member 27 and pressurized spring 28 may be omitted. Pick-up tool 50 has been described as being compatible with nozzle 25, but the present disclosure is not particularly limited thereto and may be made to be incompatible with nozzle 25. Furthermore, pick-up tool 50 is assumed to have bent wall 56 and protruding portion 58, but one or more of these may be omitted.

In the above-described embodiment, mounting head 22 is assumed to move both nozzle 25 and pick-up tool 50, but it may have a dedicated moving head for moving pick-up tool 50. Also in this mounting device 11, the moving of backup pin 40 can be performed more reliably.

The embodiment described above has the capability to determine whether backup pin 40 was picked up in a normal manner by pick-up tool 50 based on the leakage pressure between support surface 43 and pressing member 59, but this may be omitted. Also in this mounting device 11, since engaging portion 44 is inserted into slit 54 and engaging portion 44 is fixed by entering groove 55 formed orthogonally to slit 54, the moving of backup pin 40 is performed more reliably. Incidentally, mounting device 11 may determine whether backup pin 40 has been picked up by pick-up tool 50 in a normal manner based on the captured image. In mounting device 11, the pick-up state of backup pin 40 can be determined even though both imaging and image processing are required.

In the embodiment described above, pressure application section 35 applies pressure to nozzle 25 and pick-up tool 50, but a dedicated pressure application section may be provided to apply pressure to pressure application section 35. Also in this mounting device 11, the moving of backup pin 40 can be performed more reliably.

In the embodiment described above, the backup pin arrangement routine is executed based on an input from the operator to begin the mounting process, but the present disclosure is not particularly limited thereto, and the backup pin arrangement routine may be configured to be executable independently. The moving of backup pin 40 can also be performed more reliably in this mounting device 11.

In the embodiment described above, backup pin 40 is fixed to backup plate 14 by a magnetic force, but the present disclosure is not particularly limited thereto and may be fixed by other than a magnetic force. For example, a bottomed hole may be formed in backup plate 14, and backup pin 40 may be inserted into and thereby fixed to the bottomed hole. The moving of backup pin 40 can also be performed more reliably in this mounting device 11.

In the embodiment described above, the present disclosure has been described as mounting device 11, but pick-up tool 50 may be used.

INDUSTRIAL APPLICABILITY

The present disclosure is applicable to the technical field of devices for picking up and mounting components.

REFERENCE SIGNS LIST

10 Mounting system, 11 Mounting device, 12 Board processing section, 13 Board support section, 14 Backup plate, 15 Pin storage section, 16 Component supply section, 18 Component mounting section, 20 Mounting section, 21 Head moving section, 22 Mounting head, 23 Syringe, 24 Nozzle, 25 Nozzle, 26 Mark camera, 27 Biasing member, 28 Pressurized spring, 30 Control section, 31 CPU, 32 Storage section, 33 Support position information, 35 Pressure application section, 35a Pipe, 36 Depressurization pump, 37 Pressurization pump, 38 Switching valve, 39 Pressure sensor, 40 Backup pin, 41 Base portion, 42 Support portion, 43 Support surface, 44 Engaging portion, 50,50B,50C Pick-up tool, 51 Main body, 52 Attaching portion, 53 Pick-up portion, 54 Slit, 55 Groove, 56 Bent wall, 57 Support portion, 58 Protruding portion, 59 Pressing member, 70 Management PC, L Length, P Component, S Board.

The invention claimed is:

1. A mounting device, configured to mount a component on a board, comprising:
    backup pins arranged on a backup plate that support the board;
    a pick-up tool including
        a flange configured to be attached to a moving head for moving a backup pin of the backup pins,
        a slit formed in an insertion direction in which a projection formed on a distal end of the backup pin is inserted, and
        a groove, being formed orthogonally to the slit, into which the projection enters;
    a moving head attached with the pick-up tool, the moving head being configured to move the pick-up tool; and
    processing circuitry configured to control the moving head and the pickup tool to insert the projection into the groove via the slit and move the backup pin between a storage section of the backup pin and the backup plate.

2. The mounting device of claim 1, comprising two or more of the slits and the grooves.

3. The mounting device of claim 1, further comprising: a pressing member configured to press the backup pin in a direction to suppress axial rotation of the backup pin when the projection is inserted into the groove.

4. The mounting device of claim 1, further comprising:
    a nozzle for picking up and moving the component.

5. The mounting device of claim 1, wherein the pick-up tool has a cylindrical body portion and a bent wall configured to bend when a predetermined stress is applied between the slit and the groove, which is adjacent to the slit.

6. The mounting device of claim 1, further comprising:
    a nozzle configured to pick up and move components, and wherein the moving head is a mounting head for picking up components.

7. The mounting device of claim 1, wherein the moving head comprises a pressure application section configured to apply pressure to the pick-up tool, and the processing circuitry determines a holding state of the backup pin held by pick-up tool based on the pressure applied to the pick-up tool.

8. The mounting device of claim 7,
    wherein the pick-up tool comprises a hollow cylindrical pressing member configured to press on an upper face of the backup pin in a direction that suppresses axial rotation of the backup pin while the projection is inserted into the groove;
    wherein the pressure application section applies pressure to the pressing member; and
    wherein the processing circuitry determines whether the backup pin is present based on leakage pressure between the upper face of the backup pin and the pressing member.

9. The mounting device of claim 7, wherein the moving head is a mounting head configured to pick up a component, and the pressure application section applies pressure to a nozzle configured to pick up a component and also applies pressure to the pick-up tool.

10. The mounting device of claim 1, wherein the backup plate fixes the backup pins with a magnetic force.

\* \* \* \* \*